United States Patent
Barsky et al.

(10) Patent No.: US 6,245,687 B1
(45) Date of Patent: Jun. 12, 2001

(54) PRECISION WIDE BAND GAP SEMICONDUCTOR ETCHING

(75) Inventors: Michael E. Barsky, Los Angeles; Rajinder R. Sandhu, Castaic; Michael Wojtowicz, Long Beach, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/491,961

(22) Filed: Jan. 26, 2000

(51) Int. Cl.[7] .................................................. H01L 21/461
(52) U.S. Cl. ................................................................ 438/746
(58) Field of Search ..................................... 438/746, 689, 438/745, 46–47; 257/94, 678, 408, 745, 750, 757, 746, 747; 216/95, 83, 48; 205/48

(56) References Cited

U.S. PATENT DOCUMENTS

| | | | |
|---|---|---|---|
| 5,690,807 | * 11/1997 | Clark, Jr et al. | 205/655 |
| 5,773,369 | * 6/1998 | Hu et al. | 438/746 |
| 5,932,896 | * 8/1999 | Sugiura et al. | 257/94 |
| 5,985,687 | * 11/1999 | Bowers et al. | 438/46 |

* cited by examiner

Primary Examiner—Matthew Smith
Assistant Examiner—Calvin Lee
(74) Attorney, Agent, or Firm—Connie M. Thousand

(57) ABSTRACT

A method for etching GaN material comprising configuring the GaN material as an anode in an electrochemical cell where the electrochemical cell is comprised of an anode, a cathode and an electrolyte, and applying a bias across the anode and the cathode to a level which is sufficient to induce etching of the material. The etch rate of the material is controllable by varying the bias level. The cell is additionally illuminated with a preselected level of UV light which provides for uniformity of the etching process. The present method is particularly useful for etching a GaN HBT from n-p-n GaN material.

9 Claims, 3 Drawing Sheets

PRECISION WIDE BAND GAP SEMICONDUCTOR ETCHING

BACKGROUND OF THE INVENTION

The present invention relates generally to etching methods and more particularly, to a method for etching Gallium Nitride (GaN) materials to produce GaN semiconductor devices.

Gallium Nitride (GaN) is a wide band gap material which possesses desirable properties for wide band gap semiconductor devices including high breakdown voltage and current handling capability. When implemented in a high power amplifier, the high breakdown voltage property of the GaN material translates into a higher power, higher efficiency amplifier when compared to similar frequency, same device periphery Gallium Arsenide (GaAs) amplifiers. The high GaN power density means that the equivalent frequency, same topology, GaN amplifier will occupy a reduced material area, approximately 100 times smaller, than the equivalent frequency GaAs amplifier. Thus, significant performance improvements can be realized from GaN devices. However, to realize the improvement from GaN devices, the device must be finely dimensioned and precisely etched. This has proven to be difficult using standard dry and wet chemical etching techniques.

Dry etching techniques have proven to be inadequate for etching GaN material since these techniques irreparably damage the GaN surface. Although high ion density plasmas have shown reduced damage when compared to lower ion density plasmas, these low damage dry etches are still highly damaged when compared to a wet chemically etched GaN surface.

Wet chemical etching provides better results than dry chemical etching for GaN material but still lacks the control necessary to precisely etch the GaN material. The current wet chemical etch technique consists of immersing the material in an etching solution and illuminating the material with ultraviolet (UV) light. The UV light induces a reaction in the material which causes atoms of the material to change from a solid phase to a liquid phase and dissolve in the etching solution thereby etching the material. This technique does not provide sufficient control to precision etch a GaN material as the primary control element is the intensity of the light and the material quality of the GaN material.

The shortfall in the prior art wet etching technique is extremely evident when it is used to etch a GaN heterojunction bipolar transistor (HBT). In etching an HBT, it is very important to etch the material in a manner which will minimize the roughness of the etched surfaces. The roughness of the etched surface is related to the diffusion of ions from the surface of the material. With the prior art wet etching method, the roughness of the etched surfaces is dependent on the uniformity of the light, the concentration of the etching solution at any point, and the quality of the material to be etched. A non-uniform illumination of the material will result in a rough surface. In addition, poor quality or defected material will result in electron hole pairs recombining at the places of the defects and etching will occur around the defects leaving intact the undesirable defect. This is particularly a problem for GaN materials since typical GaN materials contain a substantial number of impurities and defects.

In addition to providing a smooth surface after etching, to form an HBT having an emitter/base/collector from n-p-n GaN material, it is very important to etch away the entire preselected portion of the emitter material and stop the etching process almost exactly at the surface of the base material so that a contact can be placed directly on the base. If too much of the emitter material remains over the base, the contact will not allow for conduction in the base layer. And, if too much of the surface of the base material is removed, the electrical properties of the HBT will be degraded. The present wet etching technique depends on the intensity of the light to control the etch depth which does not provide sufficient control to stop the etching at an exact point. Therefore, when applied to n-p-n GaN material, the prior art wet etching method typically over etches or under etches the material resulting in a poor performing HBT.

What is needed therefore is a method for precision etching of GaN material which provides for improved surface smoothness and is operable to selectively etch n-p-n GaN material to produce GaN HBT's.

SUMMARY OF THE INVENTION

The preceding and other shortcomings of the prior art are addressed and overcome by the present invention which provides a method for etching GaN material. The method comprises configuring the GaN material as an anode in an electrochemical cell where an electrochemical cell is comprised of an anode, a cathode and an electrolyte held together in a container. The cell is configured to induce etching of the GaN material. In a first aspect, a bias is applied across the anode and the cathode to a level which is greater than the standard electrochemical cell potential of the cell to induce etching of the material. The level of the bias can be adjusted to selectively control the etch rate.

In a second aspect, the etching process is assisted by illuminating the material with an ultraviolet light while the bias is being applied.

In a third aspect, the present invention provides a method for producing a GaN heterojunction bipolar transistor (HBT) from an n-p-n GaN material having a p-GaN layer sandwiched between first and second n-GaN layers. The method comprises masking portions of the first n-GaN layer leaving unmasked a portion of the first n-GaN layer. The GaN material is configured as an anode in an electrochemical cell, where the electrochemical cell comprises an anode, a cathode and an electrolyte. A bias is applied across the anode and cathode to a first level sufficient to etch away the unmasked portions of the first n-GaN layer.

A preselected portion of the p-GaN layer is then masked leaving unmasked a preselected portion of the p-GaN layer to be etched. A second bias is applied across the anode and the cathode to a second level which is sufficient to etch away the unmasked portion of the p-GaN layer. Contacts are attached to the surfaces of the p-GaN layer and the n-GaN layers and voltages and currents are applied to the contacts to form the HBT.

In a fourth aspect, the etch rate and etch selectivity between n-GaN and p-GaN is controlled by selectively setting the level of the bias; and, in a fifth aspect, the material is illuminated with UV light while the biases are applied to assist in the etching of the material.

BRIEF DESCRIPTION OF THE DRAWINGS

Reference is now made to the detailed description of the preferred embodiments, illustrated in the accompanying, drawings in which.

DETAILED DESCRIPTION OF THE PREFERRED EMBODIMENTS

Figure 2:
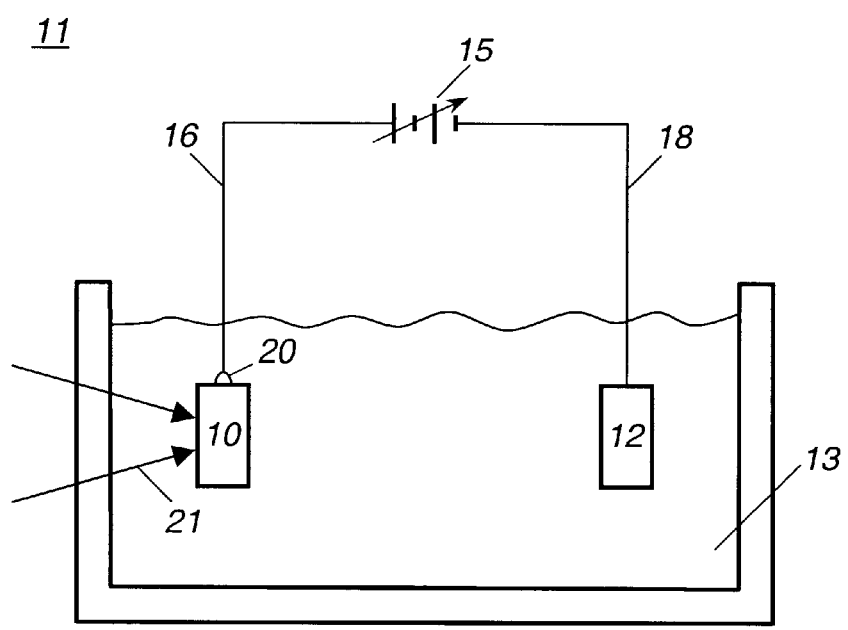
FIG. 2 shows the etching method according to a second embodiment of the present invention
Figure 3:
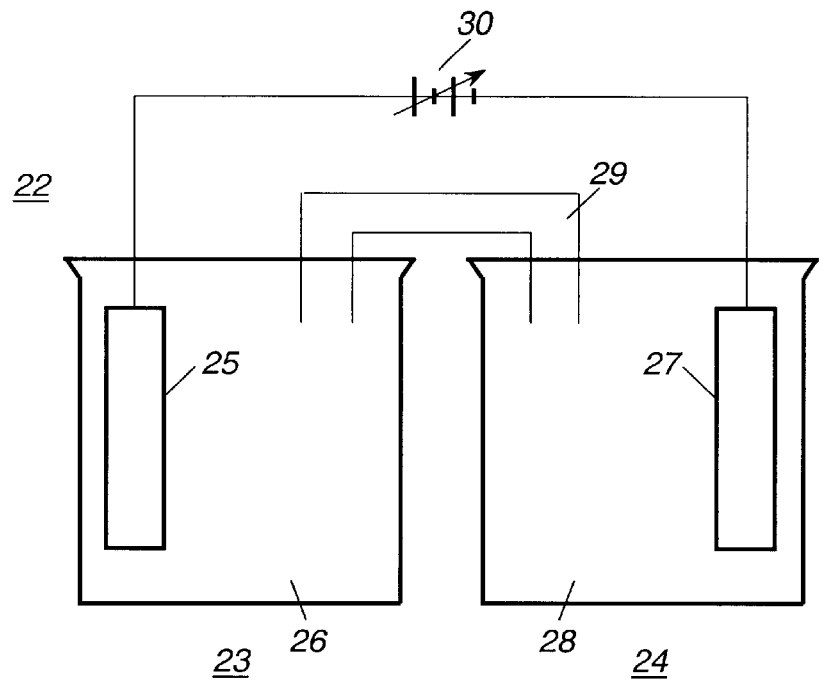
FIG. 3 shows the etching method according to a third embodiment of the present invention.
Figure 4:
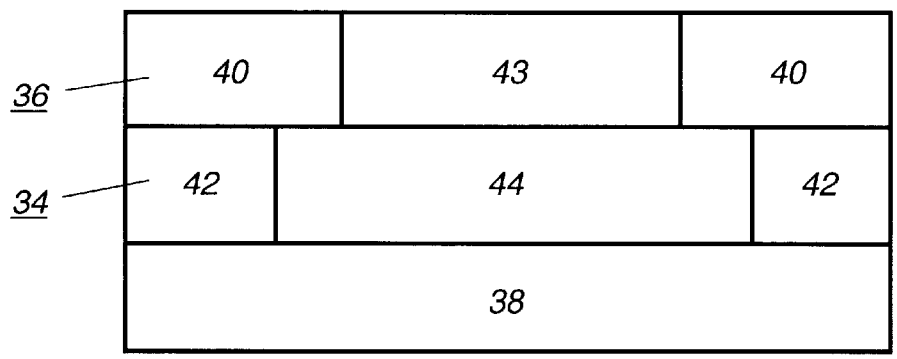
FIG. 4 shows an n-p-n GaN material.
Figure 5:
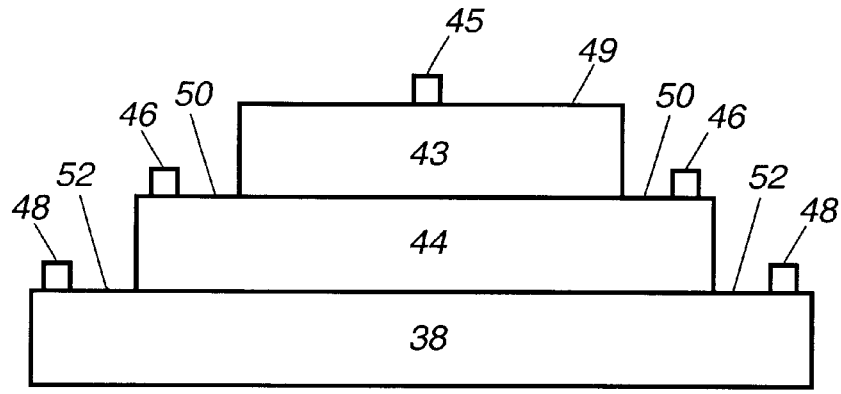
FIG. 5 shows a transistor formed by applying the method of the present invention to the material of FIG. 4; and, FIG. 6 shows the etching method according to a second embodiment of the present invention used to etch the n-p-n material of FIG. 4.
Figure 6:
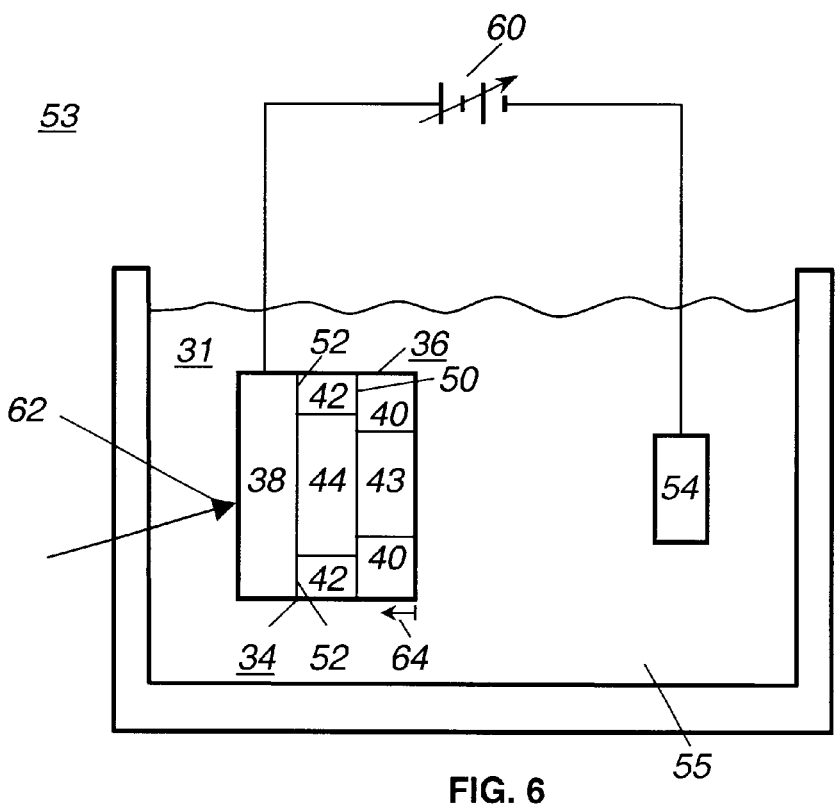

The present invention relates to a method for etching a Gallium Nitride (GaN) layer. More specifically, the present invention relates to a method for precision etching of GaN materials particularly n-p-n GaN materials to form GaN HBT's. The method of the present invention is preferably used to etch a GaN semiconductor device such as a transistor, but, can be used to etch GaN material for any application. For illustration, the steps of the method are generally described and illustrated in FIG. 1. FIGS. 2 & 3 depict additional or alternative steps used to etch a GaN material in accordance with the present invention. FIGS. 4 & 5 show an n-p-n GaN material and a transistor formed from etching the n-p-n GaN material of FIG. 4, respectively. FIG. 6 depicts the method used according to the present invention to etch the transistor of FIG. 5 from the GaN material of FIG. 4.

Figure 1:
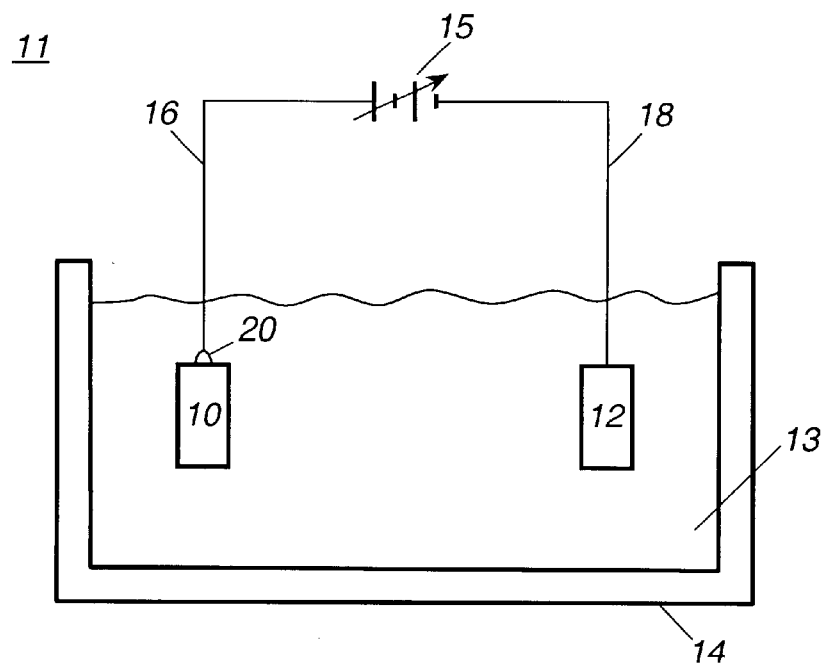
FIG. 1 shows the etching method according to a first embodiment of the present invention used to etch a GaN material.

Initially, as illustrated in FIG. 1, a GaN material 10 is provided. The first step in the process is to configure the GaN material 10 as an anode 10 in an electrochemical cell 11. An electrochemical cell 11 is comprised of an anode 10, a cathode 12 and an electrolyte 13 held in a container 14, as such, to configure the GaN material 10 as an anode requires providing a cathode 12 and an electrolyte 13 for the anode 10 where the cathode and electrolyte 13 have preselected material and chemical properties. The cathode is preferably fabricated of a platinum material (Pt) but can be fabricated of any material known to one skilled in the art to be configurable as a cathode. The electrolyte 13 is preferably a base solution such as potassium hydroxide or a dilute acid such as sulfuric acid.

Each electrochemical cell 11 has a standard electrochemical cell potential which is defined as the voltage bias required to overcome all losses in the cell 11 and run the cell 11. If the electrochemical cell potential is greater than zero, the next step in the process is to add the correct amount of voltage to the cell 11 to run the cell 11. To do so, the GaN material (anode) 10 is connected to a bias source 15 such as a variable voltage source 15 which is preferably positioned distal to the electrolyte 13 The GaN material (anode) 10 is connected to one terminal of the bias source 15 as indicated by the line marked 16 and the cathode is connected to the other terminal of the bias source 15 as depicted by the line marked 18.

The voltage provided by the bias source 15 is slowly increased until it is observed that the GaN material 10 begins to etch. Since the GaN material 10 has material properties which produce resistive material losses and the electrolyte 13 has chemical properties which produce resistive solution losses, the voltage provided by the bias source 15 must be greater than the resistive losses of both the electrolyte 13 and the GaN material 10 as well as the standard electrochemical cell potential of the cell 11 to begin the etching process. Once the bias voltage exceeds the resistance losses and the standard electrochemical cell potential of the cell 11, gallium ions will be electrochemically solvated while nitrogen gas is released which begins the etching process. As an example, an approximately 0.8 volt bias is needed to induce etching of a GaN material 10 in a cell 11 where the GaN material 10 is configured as the anode 10 the cathode is fabricated of a platinum material and the electrolyte 13 is a potassium hydroxide solution.

The rate at which the GaN material 10 is etched is proportional to the level of the bias voltage provided by the bias source 15 As such, the etch rate of the GaN material 10 can be controlled by increasing or decreasing the level of the bias voltage. To stop the etching process simply requires lowering the level of the bias voltage to a level which is below the losses and/or the standard electrochemical cell potential.

Applying a bias across the GaN material 10 and the cathode typically requires a contact 20 between the wire 16 and the material 10 The voltage generated by the bias source 15 is applied to the GaN material 10 through the contact 20 and travels from the contact 20 across the surface of the material 10. The surface of the GaN material 10 has a resistance which decreases the level of the applied voltage as the voltage moves over the surface of the material 10 resulting in areas of the material 10 which are located near the edges of the material 10 to be exposed to a low voltage level and thus, not etch properly. One method to combat this problem is to increase the level of the applied voltage. However, this has been shown to have the undesirable effects of forming a conduction path between the contact 20 and the cathode causing the contact 20 to undergo an undesirable etching reaction. To guard against this, the contact 20 can be configured as a gridline contact 20 which extends in a grid-like pattern across the material 10. It is preferred that the portions of the contact 20 which are not actually touching the material 10 be coated with an insulating material to prevent etching of those surfaces of the contact 20 Alternatively, the contact 20 can be fabricated of a material having substantially similar properties to the cathode so that an electric potential cannot build up between the contact 20 and the cathode 12 and, as such, a reaction cannot be facilitated. For example, the contact 20 and the cathode can both be fabricated of a platinum material.

Referring to FIG. 2, for the preferred embodiment of the invention, the GaN material 10 is illuminated with a preselected amount of ultraviolet light, depicted by the arrows marked 21 while the bias voltage is applied from the bias source 15. Doing so expedites the etching process, allows the GaN material 10 to be etched at a faster rate than using a bias voltage alone and provides a precisely etched surface of the GaN material 10. Exposing the GaN material 10 to UV light 21 induces a reaction so that electrons from the material 10 transfer to the cathode and gallium (Ga) atoms dissolve from the solid phase to a liquid phase which begins the etching of the GaN material 10. As previously described, the bias level controls the rate at which the GaN material 10 etches. For example, a high bias level will result in a high etch rate, reducing the bias level slows down the etch rate, and, reversing the bias level stops the etching process even in the presence of the UV light 21. This provides for a significant amount of control of the etching process.

For etching of some GaN and GaN-based materials, it may be desirable to minimize the amount of bias voltage applied by the bias source 15 between the anode 10 and the cathode 12. One method to do so is to reduce or eliminate the electrochemical potential of the electrochemical cell thereby lowering the voltage which must be applied to run the cell 1.1 As shown in FIG. 3, one method to accomplish this is to configure the cell 22 as two coupled together half cells 23, 24. The anodic half cell 23 is comprised of the GaN material 25 in a first solution 26 and the cathodic half cell 24 is comprised of a cathode 27 in a second solution 28. The half cells 23, 24 are coupled together by a salt bridge 29 The electrochemical cell potential of the cell 22 is the difference between the cell potentials of the anodic 23 and cathodic 24 half cells. The chemical compositions of each solution 26, 28 and the material of the cathode 27 are selected to provide the desired electrochemical potential of the cell 22. Referring now to both FIG. 3 and Table I, column I of Table 1 shows the chemical composition of various cathodic half cells 24 which could be used for the present invention. Column II provides the cell potential ($E_{cathode}$) of each cathodic half cell 24 Column III provides the standard electrochemical cell potential ($E_{cell}$) of each cathodic half cell 24 when coupled by a salt bridge 29 to an anodic half cell 23 having an anodic cell potential ($E_{anode}$) of 0.8 Volts, where $E_{cell}=E_{cathode}-E_{anode}$.

TABLE 1

| Cathodic Half Cell (24) | $E_{cathode}(V)$ | $E_{cell}(V)$ |
|---|---|---|
| $MnO_4^- + 4H^+ + 3e^- \rightarrow MnO_2(s) + 2H_2O$ | 1.69 | 0.89 |
| $PbO_2(s) + 4H^+ + 2e^- \rightarrow Pb^{2+} + 2H_2O$ | 1.45 | 0.45 |
| $MnO_2(s) + 4H^+ + 2e^- \rightarrow Mn^{2+} + 2H_2O$ | 1.23 | 0.43 |
| $Ag^+ + e^- \rightarrow Ag(s)$ | 0.8 | 0 |

As is clearly shown in Table 1, the standard electrochemical cell potential of the cell 22 is selectable, controllable and thus reducible by a selective choice of the chemical composition of the solutions 26, 28 and the material of the cathode 27. As depicted in the last row of Table I, a proper selection of the materials and solutions for the cell 22 can actually reduce the electrochemical cell potential ($E_{cell}$) to zero creating a galvanic cell 22 which will run spontaneously with no bias voltage required. However, even if the cell 22 is configured to run spontaneously, it is preferred to include a variable voltage source 30 between the anode 25 and cathode 27 to provide for etch rate control as previously discussed.

Referring now to FIGS. 2 & 4–6, the present invention is particularly useful for etching a GaN material 31 to form a GaN transistor 32 or GaN semiconductor device. To do so, the first step is to provide a GaN material 31 having a layer of p-GaN material 34 sandwiched between two layers 36, 38 of n-GaN material. To form the transistor of FIG. 5 requires removing a selected portion 40 of the first n-GaN layer 36 and a selected portion 42 of the p-GaN layer 34 by etching away these portions 40, 42. To form a transistor 32 from the etched GaN material, the remaining portion 43 of the first n-GaN layer 36 is configured as the emitter; the remaining portion 44 of the p-GaN layer 34 is configured as the base; and the second n-GaN layer 38 is configured as the collector of the transistor 32. Contacts 45–48 are placed on the exposed surfaces 49–52 of the emitter 43, base 44 and collector 38 respectively. These contacts 45–48 are biased with voltages and currents to form the transistor 32.

The portions 40, 42 of the GaN material 30 are preferably etched away with the aid of a masking technique known to one skilled in the art. To do so, a portion 43 of the first n-GaN layer 36 is masked off leaving unmasked a second portion 40 of the first n-GaN layer 36 to be etched away.

Referring to FIG. 6, the masked GaN material 30 is configured as an anode 30 in an electrochemical cell 53 which includes a cathode 54 and an electrolyte 55. The GaN material 30 and cathode 54 are connected to a variable biasing source 60 which is operable to apply a selectable bias level across the GaN material 30 and the cathode 54. The GaN material 30 is illuminated with UV light 62 while the bias is simultaneously applied between the GaN material 30 and the cathode 54 by the bias source 60 The bias level is supplied to a sufficient level to overcome all losses of the electrolyte 55 the cathode 54 and the GaN material 30 which induces etching of the unmasked portion 40 of the first n-GaN layer 36 The bias is continually applied to a level which is greater than the resistive losses of the electrolyte 55, the cathode 54 and the GaN material 30 as well as the standard electrochemical cell potential to continue the etching of the first n-GaN layer 36 at a desired rate until the unmasked portion 40 of the first n-GaN layer 36 is removed exposing the top surface 50 of the p-GaN layer 34.

The present etching method provides for a smoother etched surface 50 than the prior art wet etch method because the present method uses a combination of both UV light 62 and bias applied by the bias source 60 to etch the first n-GaN layer 36. The application of the bias not only diminishes the effect of non-uniform illumination of the UV light 62 on the roughness of the surface 50, but additionally assists in the etching of any defects which may be present in the first n-GaN layer 36.

One key advantage of the present invention is the ability to selectively stop the etching process at any preselected depth. The level of the bias applied by the bias source 60 is related to the resistance of the material to be etched. The higher the resistance, the higher the bias level must be to etch the material. The resistance of the n-GaN layer 36 increases with depth 64 This property of the n-GaN layer 36 allows the operator to selectively set the bias source 60 to a level which will overcome the resistance of the n-GaN layer 36 only to the preselected depth. By doing so, the n-GaN layer 36 will stop etching at the preselected depth.

Another advantage of the present method is the ability to stop the etching of the first n-GaN layer 40 almost exactly at the surface 50 of the p-GaN layer. This is important for an HBT because the remaining portions 43, 44 of the first n-GaN layer 36 and p-GaN layer 34 will be the emitter 43 and base 44 respectively of the transistor 32. As such, a highly efficient HBT needs a contact 46 positioned directly on the surface 50, of the base layer 44. If too much of the emitter layer 40 remains over the base surface 50, the contact 46 will not allow for conduction in the base layer 44. And, if too much of the surface 50 of the base layer 44 is removed, the electrical properties of the transistor 32 will be degraded.

The resistance of the base layer 34 is higher than the resistance of the emitter layer 36 As such, the level of the bias applied by the battery 60 can be adjusted and set to a sufficient level to overcome the resistance of the emitter layer 36 which removes the selected emitter layer 40 but is insufficient to overcome the resistance of the base layer 34 so that none of the base layer 34 is removed.

Preferably, the amount of bias required for a selected etch depth 64 or to stop the etching process at the surface 50 of the base layer 34 would be selected with the assistance of laboratory test data. To do so, a curve of bias level verse etch depth 64 would preferably be generated from applying the above method to test samples and characterizing the bias level required for each etch depth 64. Data from this curve would then be used to set the bias voltage 60. Alternatively, the bias voltage 60 could be selectively adjusted while the GaN material 31 was monitored and the bias level could be lowered or removed when the GaN material 30 was etched the desired amount.

To complete the HBT 30, a first portion of the p-GaN layer 34 is masked off leaving exposed a second portion 42 of the p-GaN layer 34 to be etched away. The GaN material 31 is again illuminated with UV light 62 and a bias is again applied from the battery 60 across the GaN material 30 and the cathode 54 to a level which will induce etching of the exposed portion 42 of the p-GaN layer 34. This bias level is continually applied until the preselected portion 42 of the p-GaN layer 34 is removed exposing the top surface 52 of the second n-GaN layer 38. Contacts 45–48 are attached to the surfaces 49–52 respectively. Voltages and currents are supplied to the contacts 45–48 to form the HBT 32.

The above method provides a method to precisely etch a GaN material which is particularly useful when applied to n-p-n GaN material to produce precisely etched GaN HBT's. The present method provides improved etching control over the methods of the prior art and thus, provides for a GaN HBT having improved performance. As will be appreciated by one skilled in the art, the present invention is not limited to the structures and figures shown and described hereinabove but can be practiced with any GaN material or other material having material properties which are closely related to that of GaN material. It will be appreciated that many variations of the invention are possible and the invention is limited only by the claims which follow.

We claim as our invention:

1. A method for etching GaN material comprising:
   configuring the GaN material as an anode in first solution having a first chemical composition forming an anodic half an anodic cell potential;
   providing a cathodic half cell for the anodic half cell in which the cathodic half cell is seperated in space from the anodic half cell and the cathodic half cell comprises a cathode fabricated of a preselected material which is immersed in a second solution having a second chemical composition, the cathodic half cell having a cathodic cell potential;
   coupling the cathodic and anodic half cells together with an external circuit; and,
   selecting the chemical composition of each of the first and second solutions and the material of the cathode so that the eletrochemical cell is a galvanic cell which will run spontaneuosly and etch the GaN material.

2. The method of claim 1, wherein the etching occurs at an etch rate, the method further comprises coupling an external bias source to the anodic and cathodic half cells and selectively varying the level of the bias to selectively control the etch depth.

3. The method of claim 2, further comprising exposing the GaN material to ultraviolet light while the basis is being applied.

4. The method of claim 2, further comprising selectively setting the bias level to etch the GaN material to a preselected depth.

5. The method of claims 1, wherein coupling the cathodic and anodic half cells together with an external circuit comprises coupling the cathodic and anodic half cells together with a salt bridge.

6. A method for producing a GaN heterojunction bipolar transistor (HBT) from a GaN material having a p-GaN layer sandwiched between first and second n-GaN layers, the method comprising the steps of:
   configuring the GaN material as an anode in a first solution having a first chemical composition forming an anodic half cell having an anodic cell potential;
   masking a first preselected portion of the first n-GaN layer so as to leave unmasked a second preselected portion of the n-GaN layer to be etched;
   providing a cathodic half cell for the anodic half cell In which the cathodic half cell is separated in space from the anodic half cell;
   coupling the cathodic and anodic half cells together to form an electrochemical cell;
   etching the first n-GaN material to a preselected n-GaN depth by selecting the composition of the cathodic and anodic half cells so that the electrochemical cell Is a galvanic cell which will run spontaneously and etch the unmasked portion of the first n-GaN material to the preselected n-GaN depth;
   masking a first preselected portion of the p-GaN layer so as to leave unmasked a second preselected portion of the p-GaN layer to be etched;
   etching the p-GaN material to a preselected p-GaN depth; and,
   attaching contacts to the exposed surfaces of each layer to form the HBT.

7. The method of claim 6, wherein the etching the first n-GaN material comprises setting the first bias level to a preselected level which is selected to etch the unmasked portion of the first n-GaN layer and stop the etching at a surface of the p-GaN layer.

8. The method of claim 6, further comprising exposing the material to ultraviolet light while the first and second bias levels are being applied.

9. The method of claim 6, wherein the etching the p-GaN material comprises setting the second bias level to a preselected level which is selected to etch the unmasked portion of the p-GaN layer and stop the etching at a surface of the second n-GaN layer.

* * * * *